United States Patent
Reboh et al.

(10) Patent No.: US 10,147,818 B2
(45) Date of Patent: Dec. 4, 2018

(54) ENHANCED METHOD OF STRESSING A TRANSISTOR CHANNEL ZONE

(71) Applicant: Commissariat A L'Energie Atomique et aux Energies Alternatives, Paris (FR)

(72) Inventors: Shay Reboh, Sassenage (FR); Benoit Mathieu, Grenoble (FR)

(73) Assignee: Commissariat à L'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/950,416

(22) Filed: Nov. 24, 2015

(65) Prior Publication Data
US 2016/0149039 A1    May 26, 2016

(30) Foreign Application Priority Data

Nov. 25, 2014   (FR) ..................... 14 61429

(51) Int. Cl.
*H01L 29/78* (2006.01)
*H01L 29/66* (2006.01)
*H01L 29/51* (2006.01)

(52) U.S. Cl.
CPC ........ *H01L 29/7849* (2013.01); *H01L 29/517* (2013.01); *H01L 29/66545* (2013.01); *H01L 29/66795* (2013.01); *H01L 29/785* (2013.01); *H01L 29/7847* (2013.01)

(58) Field of Classification Search
CPC ........... H01L 29/66545; H01L 29/7847; H01L 29/7849
See application file for complete search history.

(56) References Cited

U.S. PATENT DOCUMENTS

| 6,281,112 B1* | 8/2001 | Sugiyama ......... H01L 21/31056 257/E21.246 |
| 8,647,952 B2* | 2/2014 | Baars .............. H01L 21/823412 257/E21.177 |
| 2005/0153486 A1 | 7/2005 | Xiang et al. |
| 2008/0191281 A1* | 8/2008 | Chidambarrao ........ H01L 21/84 257/351 |
| 2009/0186455 A1 | 7/2009 | Bedell et al. |

(Continued)

OTHER PUBLICATIONS

U.S. Appl. No. 14/791,713, filed Jul. 6, 2015, Shay Reboh et al.

(Continued)

*Primary Examiner* — Joseph C Nicely
*Assistant Examiner* — David Goodwin
(74) *Attorney, Agent, or Firm* — Oblon, McClelland, Maier & Neustadt, L.L.P.

(57) ABSTRACT

A method of straining a transistor channel zone is provided, including a) forming a plurality of stress blocks based on a material having an intrinsic stress, around a zone based on a semiconducting material in which a transistor channel will be made and on which a transistor gate will be formed, the stress blocks inducing a stress in the zone; b) forming a gate block on the zone, the gate block being disposed between the stress blocks; and c) at least partially removing the stress blocks without removing the gate block, wherein the gate block has a Young's modulus and a thickness such that the stress blocks are at least partially removed in step c) and the induced stress is at least partially maintained in the zone after the stress blocks are at least partially removed.

15 Claims, 10 Drawing Sheets

(56) References Cited

U.S. PATENT DOCUMENTS

| | | | |
|---|---|---|---|
| 2009/0321843 A1* | 12/2009 | Waite | H01L 21/823807 257/369 |
| 2010/0109091 A1 | 5/2010 | Griebenow et al. | |
| 2011/0260258 A1* | 10/2011 | Zhu | H01L 21/823807 257/369 |
| 2012/0001263 A1* | 1/2012 | Richter | H01L 21/31053 257/368 |
| 2012/0153398 A1* | 6/2012 | Baars | H01L 21/823412 257/369 |
| 2013/0248985 A1* | 9/2013 | Amarnath | H01L 29/66545 257/330 |
| 2014/0256109 A1 | 9/2014 | Yin et al. | |
| 2014/0264632 A1* | 9/2014 | Richter | H01L 29/66795 257/401 |
| 2015/0145066 A1* | 5/2015 | Lu | H01L 29/66795 257/401 |
| 2015/0155170 A1 | 6/2015 | Reboh et al. | |
| 2015/0179474 A1 | 6/2015 | Maitrejean et al. | |
| 2015/0179665 A1 | 6/2015 | Reboh et al. | |
| 2015/0243526 A1* | 8/2015 | Hsiao | H01L 21/324 438/289 |
| 2016/0141394 A1* | 5/2016 | Lu | H01L 29/66795 438/283 |

OTHER PUBLICATIONS

U.S. Appl. No. 14/802,283, filed Jul. 17, 2015, Perrine Batude et al.
U.S. Appl. No. 14/950,416, filed Nov. 24, 2015, Shay Reboh et al.
French Preliminary Search Report datd Jul. 9, 2015 in French Application 14 61429, filed on Nov. 25, 2014 ( with English translation of Categories of Cited Documents).
Kwan-Yong Lim et al., "Novel Stress-Memorization-Technology (SMT) for High Electron Mobility Enhancement of Gate Last High-k/Metal Gate Devices", IEEE 2010, 4 pages.
Y.Y.Wang et al., "Strain Mapping of Si Devices with Stress Memorization Processing", Applied Physics Letters 103, 2013, 6 pages.
K. Ota et al."Novel Locally Strained Channel Technique for High Performance 55nm CMOS", IEDM Tech Dig. 2002, 4 pages.
D.V.Singh et al., "Stress Memorization in High-Performance FDSOI Devices with Ultra-Thin Silicon Channels and 25nm Gate Lengths", IEDM 2005, 4 pages.
S.M. Pandey et al., "Mechanism of Stress Memorization Technique (SMT) and Method to Maximize Its Effects", IEEE Electron Device Letters, vol. 32, No. 4, 2011, 3 pages.

* cited by examiner

ENHANCED METHOD OF STRESSING A TRANSISTOR CHANNEL ZONE

TECHNICAL DOMAIN AND PRIOR ART

This description relates to the domain of transistor structures, and more particularly structures provided with a strained or mechanically strained channel zone.

Mechanical strain means a material for which the crystalline lattice parameter(s) has (have) been extended or shortened.

In the case in which the strained lattice parameter is larger than the so-called "natural" parameter of a crystalline material, the material is said to be strained in tension. When the strained lattice parameter is shorter than the natural lattice parameter, the material is said to be in compressive strain or in compression.

These mechanical strain states are associated with mechanical stress states. As a result, these mechanical strain states are frequently referred to as mechanical stress states. Throughout the remainder of this application, this concept of "strain" will be generically referred to by the term «stress».

A stress applied to a semiconducting material induces a change in the crystalline lattice and therefore its band structure, which will result in a change in the mobility of charge carriers in this material.

The mobility of electrons is increased or reduced by a tensile or compression stress respectively in the semiconducting material in which they transit, while the mobility of holes will be increased or reduced when the semiconductor is in compression or in tension respectively.

So-called a «Stress Memorization Techniques» (SMT) have been developed to generate a stress in a transistor channel.

An example of such a method is described in the document entitled «Novel Stress Memorization Technology (SMT) for High Electron Mobility Enhancement of Gate Last High-k/Metal Gate Devices» by Lim et al. IEEE 2010, and also in document «Strain mapping of Si devices with stress memorization processing», by Wang et al. Applied Physics Letters 103 (2013).

This method particularly includes amorphisation and recrystallisation steps to create dislocations generating stresses in a semiconducting material.

The following documents:
"Novel Locally Strained Channel Technique for High Performance 55 nm CMOS", by Ota et al., IEDM Tech. Dig., 2002;
"Stress Memorization in High-Performance FDSOI Devices with Ultra-Thin Silicon Channels and 25 nm Gate Lengths", by Singh et al., IEDM, 2005;
"Mechanism of Stress Memorization Technique (SMT) and Method to Maximize Its Effect", by Pandey et al., IEEE ELECTRON DEVICE LETTERS, VOL. 32, NO. 4, 2011, disclose other methods of memorising stress in a semiconducting channel zone in a transistor.

The problem that arises is to find a new method for stressing a transistor semiconducting channel zone.

PRESENTATION OF THE INVENTION

This invention relates firstly to a method of straining a semiconducting zone that will form a transistor channel comprising steps to:
a) form one or several stress blocks based on a material with an intrinsic stress around a zone based on a semiconducting material in which a transistor channel will be made and on which a transistor gate will be formed, the stress block(s) being arranged to induce a given stress in this zone;
b) form a gate block on this semiconducting zone comprising at least one dielectric material deposited on the semiconducting material;
c) at least partially remove the stress block(s).

The gate block is chosen in step b) with a Young's modulus and thickness such that the stress blocks are at least partially removed in step c), the given stress is at least partially maintained in the channel zone.

The stress initially induced by the stress blocks in the semiconducting zone is thus fixed or memorised.

The gate block includes at least one dielectric material formed on the semiconducting zone. The gate dielectric material is advantageously chosen to have a high Young's modulus, in particular higher than that of the semiconducting material in the semiconducting zone in which the channel is to be formed.

For a given thickness, the fact of providing a gate dielectric material with a high Young's modulus can improve the stress preservation in the channel zone once the stress blocks have been at least partially removed.

The gate dielectric material with a high Young's modulus may be a High-k type material such as $HfO_2$ or $Al_2O_3$ or $HfSiO_xN_y$.

The gate material located on the gate dielectric will preferably be chosen using identical criteria, with a high Young's modulus and in particular higher than that of the semiconducting material in the semiconducting zone in which the channel is to be formed.

According to one possible embodiment, a sacrificial gate can be formed on said semiconducting zone before step a), the stress block(s) made in step a) being arranged in contact with this sacrificial gate, the method also comprising a step to remove the sacrificial gate, after step a) and before step b).

In particular, the sacrificial gate makes it easier to position the stress blocks.

Thermal annealing can be made before removal of the sacrificial gate, particularly at high temperature, to enable expansion of the sacrificial gate.

According to one possible embodiment of the method, additional steps can be implemented after step c) to:
  deposit another layer based on a stress material with an intrinsic elastic stress, then
  perform thermal annealing.

If the stress material is a dielectric material, the method may also include the formation of insulating spacers for the transistor gate in the dielectric stress material.

According to one possible embodiment of the method, the semiconducting channel zone is provided in a region of a surface layer delimited by one or several trenches filled with an insulating material and/or on a layer of insulating material.

In this case, the method may also comprise a thermal annealing step after step b) so as to make the insulating material creep.

The method may be applied to a semiconductor on insulator type substrate. In this case, the semiconducting zone may be located in a surface layer of the substrate and be supported on an insulating layer of the semiconductor on insulator substrate.

The method may be applied to the production of planar transistors.

According to one possible particular embodiment of the method, the transistor may be a finFET type transistor, in this case the semiconducting zone being provided in a semiconducting bar.

BRIEF DESCRIPTION OF THE DRAWINGS

This invention will be better understood after reading the description of example embodiments given purely for information and in no way limitative, with reference to the appended drawings on which.

Identical, similar or equivalent parts of the various figures have the same numeric references to facilitate comparisons between the different figures.

The various parts shown in the figures are not necessarily all at the same scale to make the figures more easily understandable.

Furthermore, throughout the following description, terms that depend on the orientation, such as «under», «on», «above», «top», «lateral» etc. of a structure are applied considering that the structure is oriented as shown on the figures.

DETAILED PRESENTATION OF PARTICULAR EMBODIMENTS

A first example of the method used to strain at least one semiconducting zone of a transistor channel will now be described with reference to FIGS. 1A-1I and FIG. 7 on which the main steps of this example method are shown.

The initial material for this method (step $E_0$ in the diagram in FIG. 7) may be a semiconductor on insulator type substrate, for example of the SOI type.

Figure 1A:
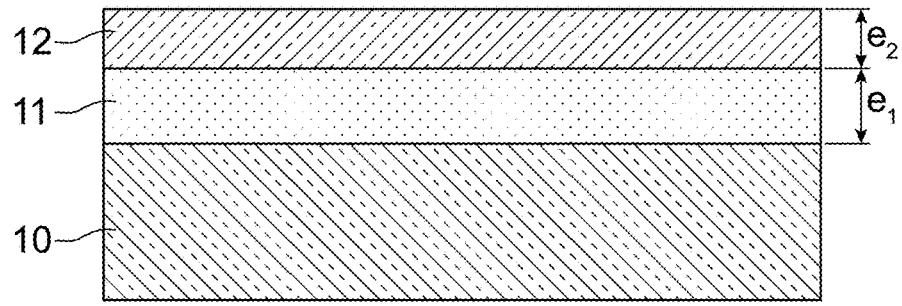
FIGS. 1A-1J show a first example of the method according to the invention to memorise a stress in a semiconducting zone of a transistor channel.
Figure 1B:
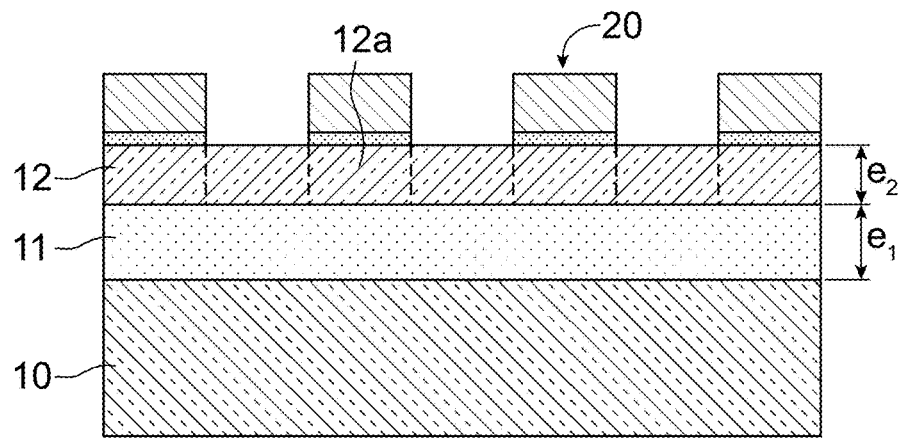
Figure 1C:
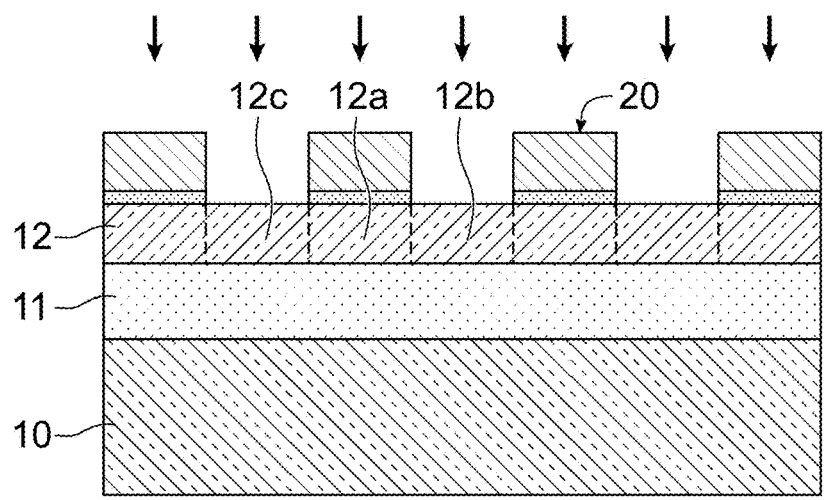

The substrate thus includes a semiconducting support layer 10, for example based on Si, and an insulating layer 11 for example based on $SiO_2$, located on and in contact with the support layer 10. The insulating layer 11 may for example be of the BOX («Buried Oxide») type with a thickness $e_1$ that may for example be between 10 nm and 100 nm. The substrate also includes a so-called «surface» semiconducting zone 12, for example based on Si, on and in contact with said insulating layer 11. The thickness $e_2$ of this surface semiconducting layer 12 may for example be between 5 nm and 50 nm (FIG. 1A).

The first step is to form at least one sacrificial gate block 20 (FIG. 1B and step E1 in FIG. 7) facing a zone 12a of the surface semiconducting layer 12 in which a transistor channel will be made. The sacrificial gate block 20 can be formed firstly by deposition of a stack comprising a layer of gate dielectric material for example such as $SiO_2$ with a thickness for example of the order of 1 to 2 nm, and then a layer of gate material for example such as polySi with a thickness that may be between 40 and 80 nm, for example of the order of 50 nm. Photolithography and then etching steps may be applied in order to define one or several sacrificial gate block(s).

The next step could be to perform doping (FIG. 1C and step E2 in FIG. 7), for example by ion implantation of regions 12b, 12c of the sacrificial semiconducting layer 12 that are not protected by the sacrificial gate block 20 and will form a source region and a drain region of the transistor respectively, on each side of the zone 12a that will form a channel.

Figure 1D:
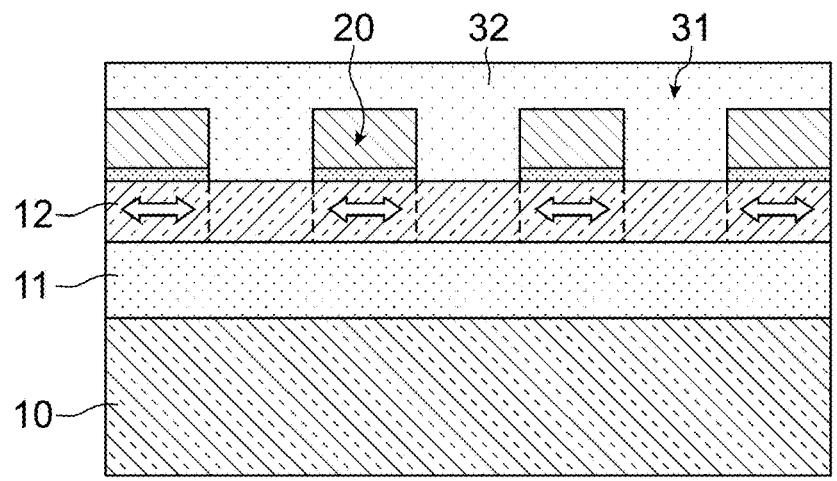
Figure 7:
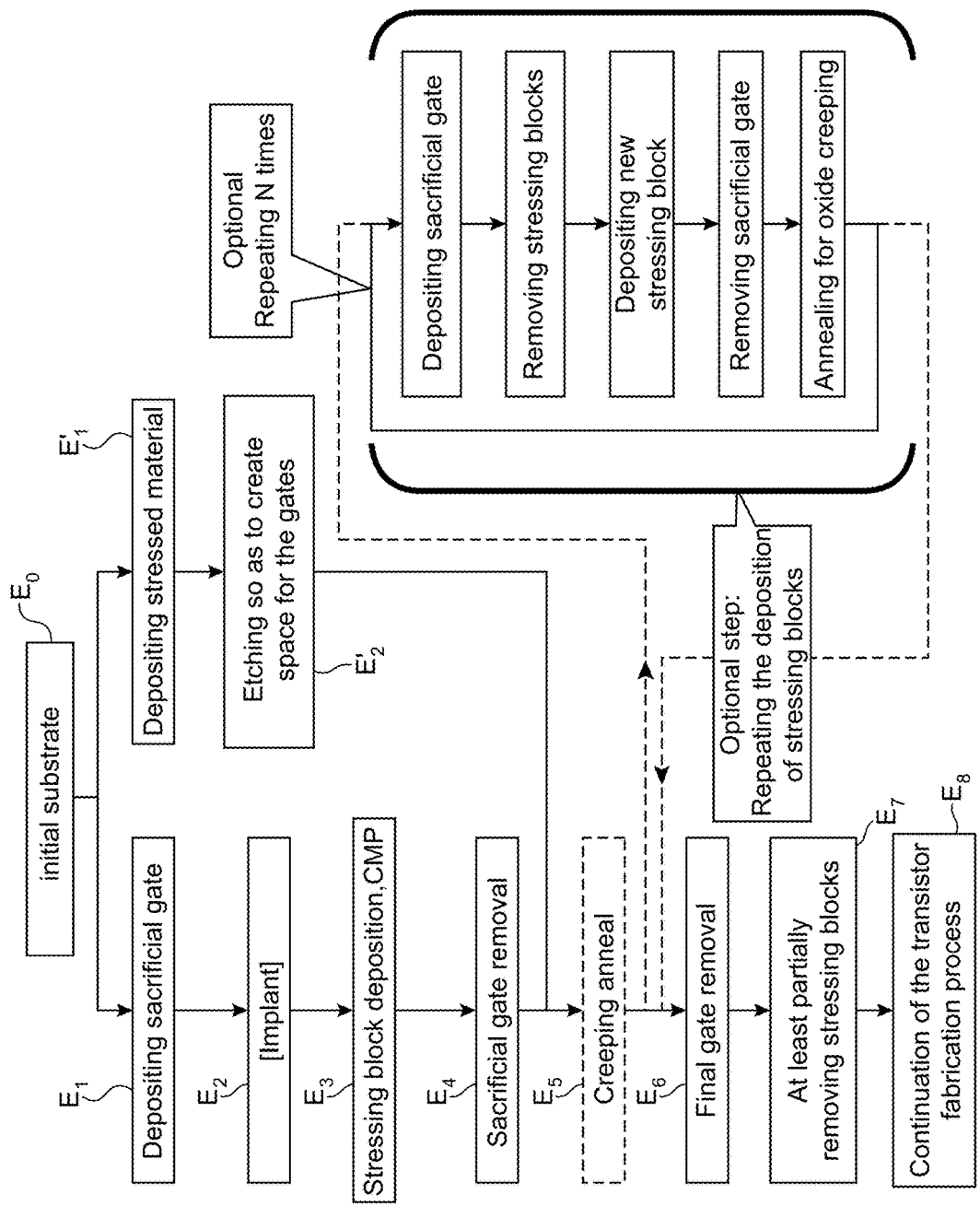
FIG. 7 shows a diagram including the steps in the first example method according to the invention and variants of this example method.

A stressing layer 31 is then formed that will induce a given stress type in the surface layer 12 of the substrate (FIG. 1D and step E3 in FIG. 7). The stressing layer 31 is deposited particularly so as to cover the sacrificial gate block 20 and the surface semiconducting layer 12 in the source and drain regions 12b, 12c. This layer 31 may be based on a material 32 for example such as silicon nitride ($Si_xN_y$) with an intrinsic elastic tensile or compression stress. A layer of silicon nitride with a thickness for example of between 20 and 150 nm, for example of the order of 80 nm and a tensile strain of the order of 1.5 GPa may for example be formed in the case in which the transistor for which the channel is to be stressed is of the NMOS type. A layer of silicon nitride with an intrinsic compression strain of the order of 1.5 GPa may for example be formed in the case in which it is required to strain the channel of a PMOS transistor.

Figure 1E:
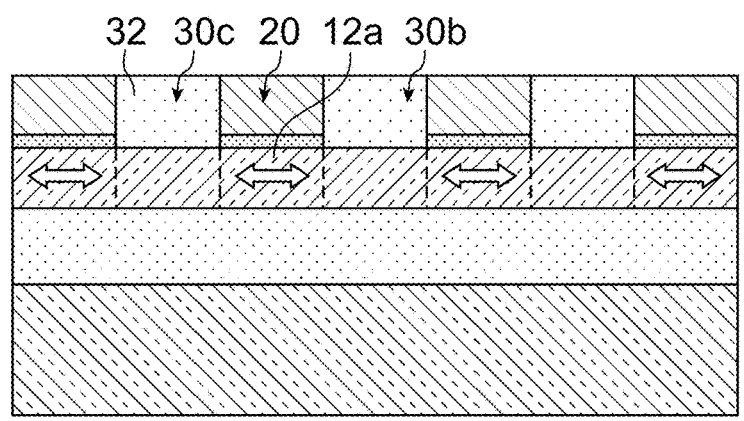

A thickness of the stressing layer 31 located above the upper face of the sacrificial block 20 can then be removed (FIG. 1E and the continuation of step E3 in FIG. 7). This removal can be done by polishing or Chemical Mechanical Planarisation (CMP) to reach the top face of the sacrificial block. The result is that blocks 30c, 30b are formed based on a stressed material 32 located on each side of the sacrificial gate block 20 and arranged in contact with the lateral flanks of this block 20.

Figure 1F:
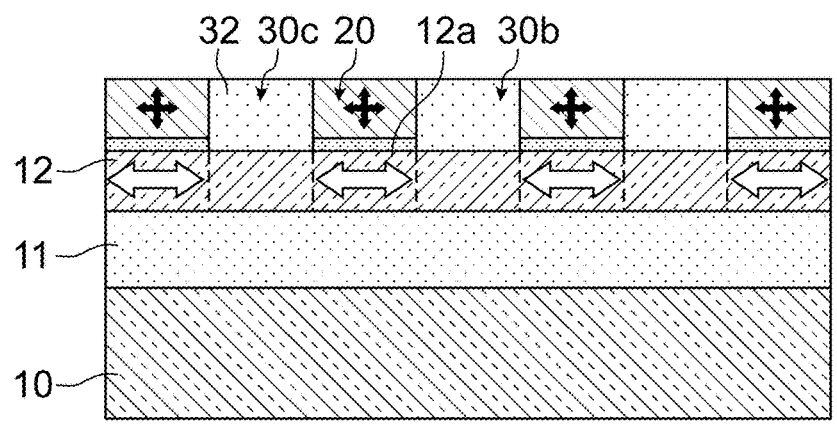

Thermal annealing can then advantageously be performed at a temperature that may for example be between 900° C. and 1100° C. The duration of this annealing may for example be between 1s (spike) and 2 minutes. Annealing may be adapted to modify the structure of the sacrificial gate 10a and cause an expansion of the gate material, particularly when the gate material is PolySi. When the strain applied in the channel zone 12a is a tensile wherein, this wherein can be amplified (FIG. 1F). As a variant, such annealing may be performed before the CMP polishing step.

Figure 1G:
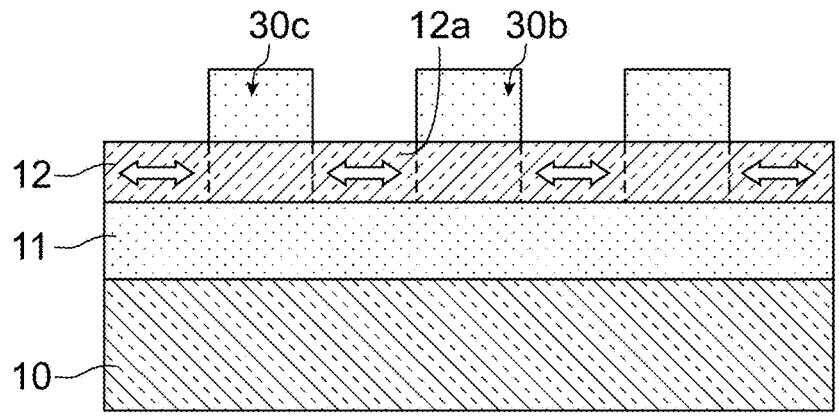

The next step is to remove the sacrificial gate block 20 (FIG. 1G and step E4 in FIG. 7). This removal may be done by selective etching of the gate stack and not the strained material 32. For example, in the case in which the sacrificial gate material is polysilicon while the strained material 32 is $Si_xN_y$, it is possible to etch polysilicon using a solution based on nitric acid (HNO3)+ and hydrofluoric acid (HF). HF etching may then be done if the sacrificial gate dielectric is $SiO_2$. This removal can improve the strain generated in the zone 12a that will form a channel of the surface semiconducting layer 12.

Thermal annealing may then be performed (step E5 in FIG. 7) to cause creep in the material in the layer 11, for example based on silicon oxide. This annealing may be performed at a temperature for example of between 1000° C. and 1250° C. for a duration for example between 1 and 10 minutes.

The next step (FIG. 1H and step E6 in FIG. 7), is to deposit a new gate block, particularly on the zone 12a in which a channel will be formed. This gate block is formed from a stack comprising a dielectric material 41 placed in contact with the surface layer and the blocks of strained material 32.

The purpose is to retain, in other words memorise the strain induced in the zone 12a in which a channel will be formed. The material in contact or close to the channel zone 12a and its thickness are chosen with this in mind. The stress memorisation effect is particularly important when the Young's modulus of the material(s) of the new gate block is (are) high, and the thickness of the material(s) of this new gate block is (are) high.

The dielectric material 41 that is in contact with the channel zone 12a is chosen for a given thickness such that its Young's modulus is high, higher than at least half the Young's modulus of the semiconducting material of the surface layer and preferably higher than the Young's modulus of the semiconducting material of the surface layer. The dielectric material 41 may for example have a Young's modulus twice as high as the Young's modulus of the material of the surface semiconducting layer. The dielectric material 41 may advantageously be a «High-k» material, for which the Young's modulus is usually higher than that of the semiconducting material of the surface layer 12 and that of the dielectric material, in this case $SiO_2$, previously used for the sacrificial gate stack.

The dielectric material 41 may for example be $HfO_2$, or $Al_2O_3$ or $HfSiO_xN_y$. The thickness of the dielectric material 41 may for example be between 0.5 and 5 nm thick.

A gate material 42 for example polysilicon or TiN is then deposited. The choice of the material 42 is preferably governed by the same criteria as for the dielectric 41. Thus, the gate material 42 is also preferably chosen to have a high Young's modulus, and particularly higher than the Young's modulus of the semiconducting material of the surface layer. The Young's modulus of the gate material 42 may for example be twice as high as the Young's modulus of the material of the surface semiconducting layer. The thickness of the gate material 42 may for example be between 10 nm and 100 nm.

Figure 1H:
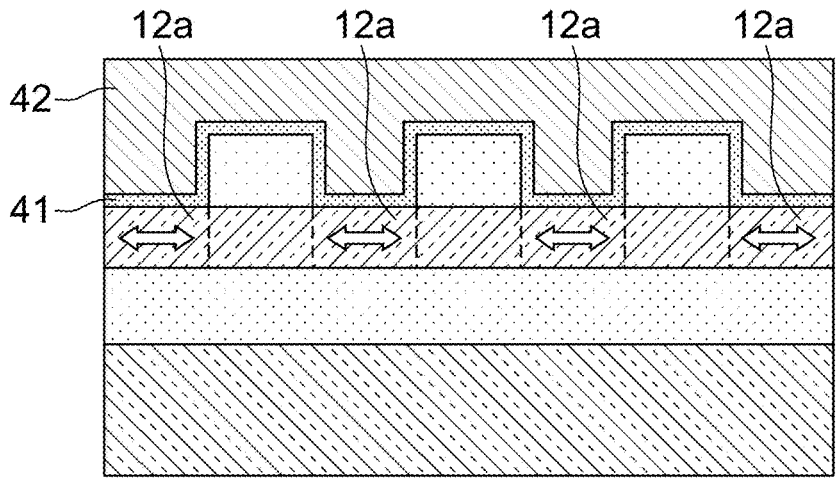
Figure 1I:
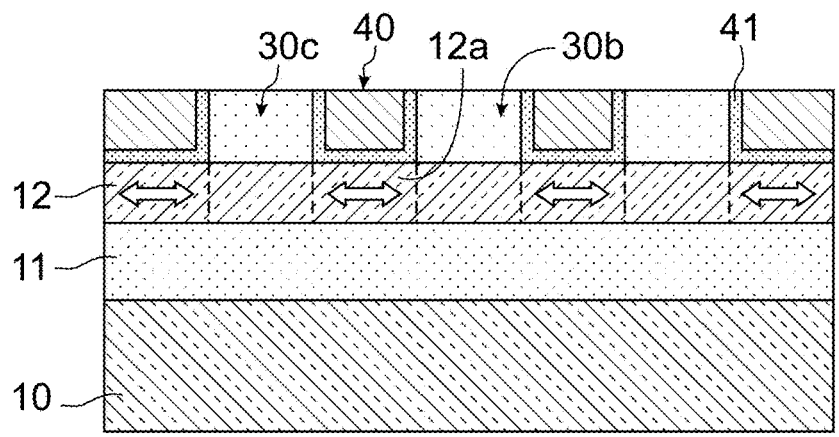

A thickness may be removed from the stack of materials 41, 42 located above the top face of the blocks 30b, 30c of stressed material 32 (FIG. 1I and the continuation of step E6 in FIG. 7). This removal may be done by chemical mechanical planarisation or polishing (CMP) to reach the upper face of the blocks 30b, 30c of stressed material 32. The result obtained is a gate block 40 facing the channel zone 12a.

Figure 1J:
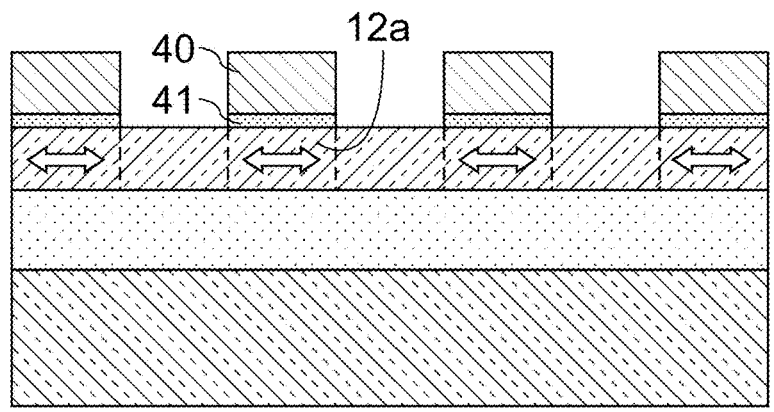

The next step is to remove the blocks 30b, 30c of stressed material 32 and possibly the residue of the dielectric material 41 (FIG. 1J). This removal can be made by selective etching of the stressed material 32 and not the materials in the gate stack. In the case in which the stressed material 32 is silicon nitride, the removal may for example be done using a phosphoric acid solution at 85% at a temperature of the order of 180° C.

After the blocks 30c, 30b of stressed material around the gate block 40 have been removed, the stress generated in the semiconducting zone 12a is at least partially kept in the channel zone 12a. This stress memorisation is possible due to the gate stack and particularly the selected gate dielectric 41, and particularly its high Young's modulus.

According to one possibility (not shown in FIG. 1J), blocks 30b, 30c may be partially removed in order to keep regions of stressed material 32 in contact with the lateral edges of the gate block 40 so as to form insulating spacers.

Other steps can then be performed in order to complete the formation of the transistor (steps E8 in FIG. 7) and particularly steps to form insulating spacers in contact with the lateral flanks of the gate, and to form source zones and drain zones, for example by growth of semiconducting zones, and to make contacts.

Figure 2A:
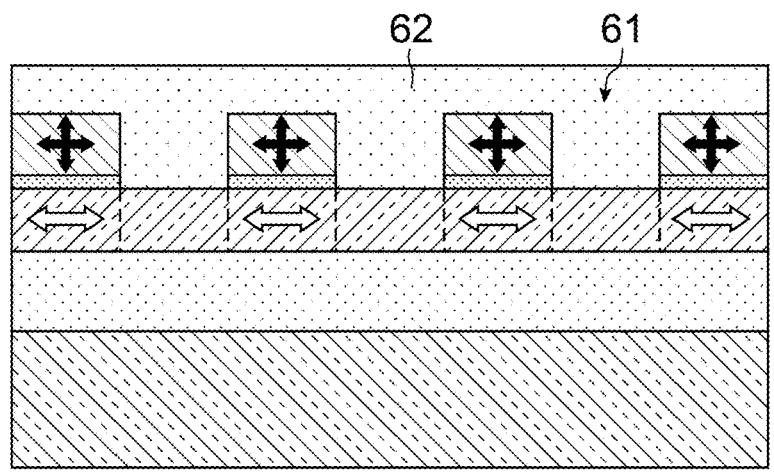
FIGS. 2A-2B show the production of insulating spacers by etching a stressing layer that can be used as part of a method according to the invention.

According to one possible particular embodiment of the first example of the method, after the stressed material described with reference to FIGS. 1H-1I has been removed, another layer 61 of material 62 with an intrinsic elastic stress can be deposited. The material 62 is a dielectric, for example such as silicon nitride $Si_xN_y$ (FIG. 2A).

Figure 2B:
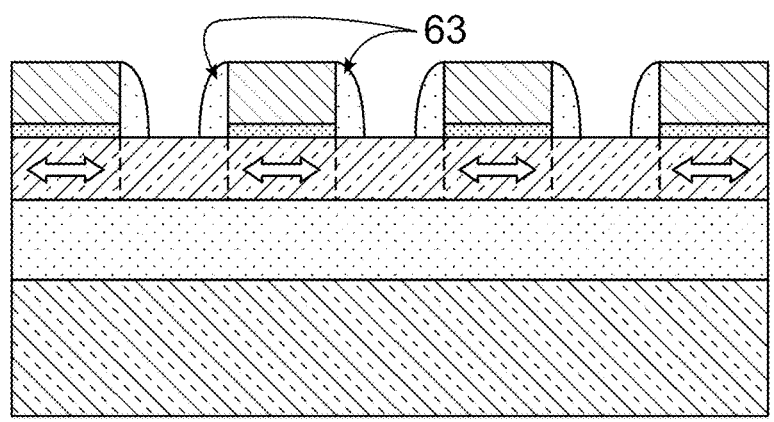
Figure 3:
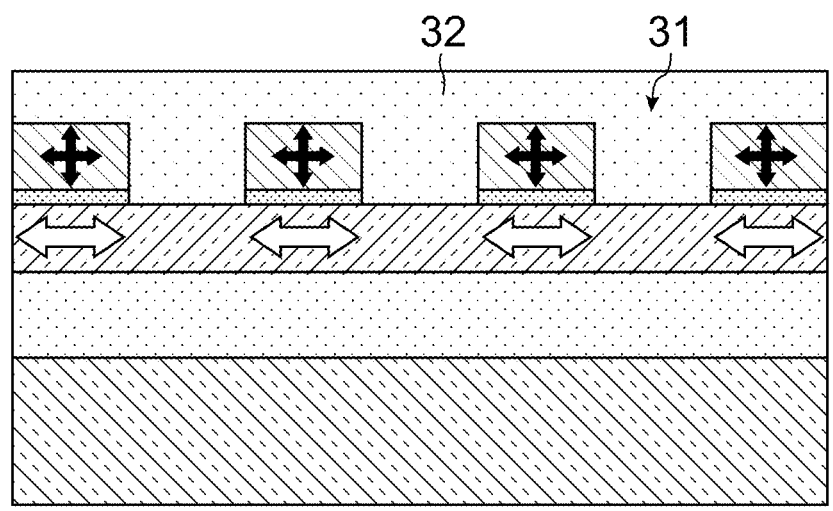
FIG. 3 shows a variant of the method according to the invention.

The next step is to form insulating spacers 63 in contact with the gate block 40, by etching the stressed dielectric material 62 (FIG. 2B).

According to one particular embodiment of the first example of the method, after the step to deposit the stressed material described with reference to FIG. 1D, thermal annealing is possible at a temperature that may for example be between 900° C. and 1100° C. The duration of this annealing may for example be between 1s (spike) and 2 minutes. The annealing may be adapted to modify the structure of the sacrificial gate 10a and cause expansion of the gate material. This can amplify the stress in the zone 12a that will be used to form a channel.

A CMP polishing step of the stressed material 32 can then be performed.

According to one particular possible embodiment of the first example of the method, after the step to remove the sacrificial gate described with reference to FIG. 1G has been performed, it is possible to perform a sequence of steps including the formation of a new sacrificial gate (step E51 in FIG. 7), and then to remove stress blocks (step E52 in FIG. 7), and then to form new stress blocks (step E53 in FIG. 7), and then remove the new sacrificial gate (step E54 in FIG. 7), and then possibly perform another creep annealing (step E55 in FIG. 7) of the material in the insulating layer of the substrate.

This sequence of steps may be repeated a given number N of times in order to increase the strain induced in the semiconducting zone 12a.

Figure 4:
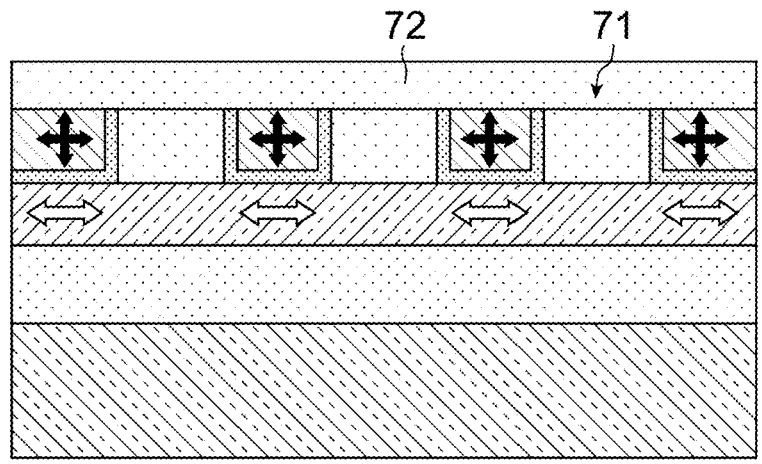
FIG. 4 shows a step in which an additional stress layer is deposited as part of a method according to the invention.

According to another variant embodiment of the first example of the method, once the step to produce the gate block 40 described above with reference to FIG. 1I has been completed, and when the stressed material 42 is a dielectric, another layer 71 of stressed material 42 can be deposited so as to cover the gate block 40 and the stressed material blocks 32. A thermal annealing like that described above and adapted to cause expansion of the gate material can then advantageously be done (FIG. 4). The insulating spacers are then formed by etching the stressed material 42.

According to another possible embodiment of the example method that has just been described, once the stressed material described with reference to FIGS. 1I-1J has been removed, another material with an intrinsic elastic stress can be deposited and high temperature annealing can then be done, for example at a temperature of more than 600° C. The stressed material is then removed once again. This can increase the stress in the semiconducting zone 12a particularly when it is stressed in tension.

A second example of a method of stressing a semiconducting zone of a transistor channel zone is shown in FIGS. 5A-5D.

Figure 5A:
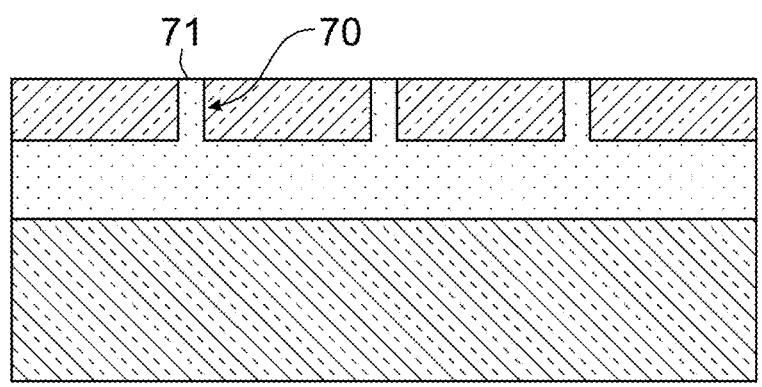
FIGS. 5A-5E show an example of a method according to the invention to memorise a stress in a semiconducting zone of a transistor channel surrounded by isolating trenches.
Figure 5B:
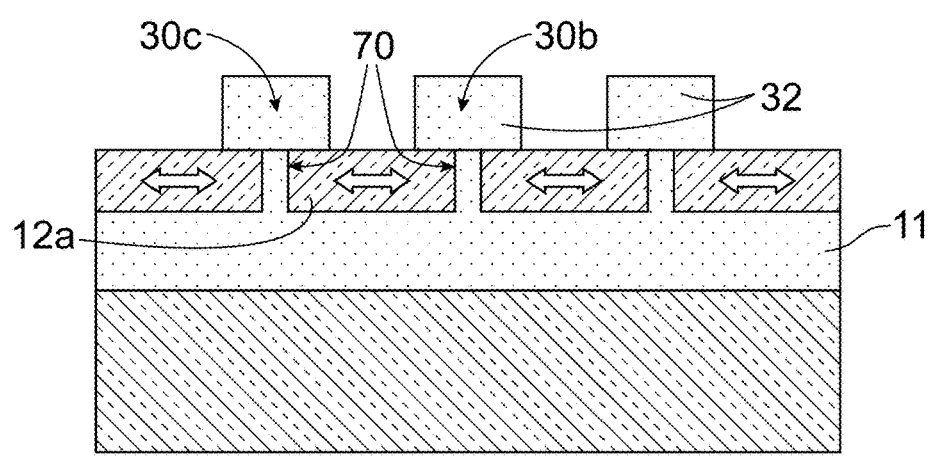

In this example, the substrate used as the initial material comprises trenches 70 filled with dielectric material 71 formed in the surface semiconducting layer 12 (FIG. 5A and step $E_0$ in FIG. 7). The dielectric filling material 71 may be the same as that used in the insulating layer 12, for example SiO$_2$. The trenches 70 can be used to delimit the active zone of the transistor and isolate this active zone from adjacent active zones.

The next step (FIG. 5B) is to form blocks 30*b*, 30*c* of stressed material 32 around a semiconducting zone 12*a* in which the transistor channel will be formed.

The blocks 30*b*, 30*c* of stressed material 32 are made by deposition of a material with an intrinsic stress such as SiN (step E'1 on the diagram in FIG. 7) then etching of this material, the space between the blocks being designed to hold a gate stack (step E'2 on the diagram in FIG. 7).

These stress blocks 30*b*, 30*c* may extend on each side of the trenches 70 of the active zone of the transistor and the adjacent active zones.

A thermal annealing step (step E5 in FIG. 7) can then be performed to make the dielectric material 71 filling the trenches 70 and the material of the insulating layer 11 of the substrate creep. Creep annealing may be performed at a temperature for example between 1000 and 1250° C. for a duration for example of between 1 and 30 minutes, advantageously of the order of 30 min. This step can increase the stress generated in the active zone and particularly in the semiconducting channel zone 12*a*.

Figure 5C:
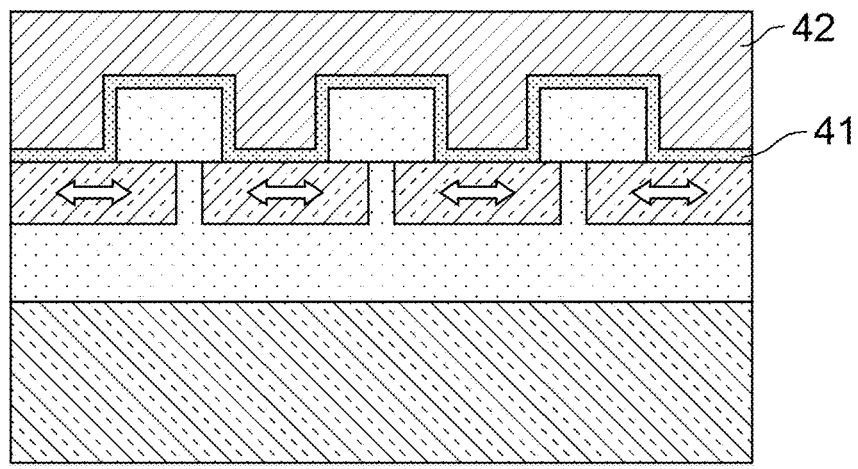

A gate stack 41, 42 is then formed on the semiconducting zone 12*a* of the stack comprising the dielectric material 41 with a high Young's modulus, for example a High-k type dielectric material such as HfO$_2$, or Al$_2$O$_3$ or HfSiO$_x$N$_y$ (FIG. 5C and step E$_6$ on the diagram in FIG. 7).

Figure 5D:
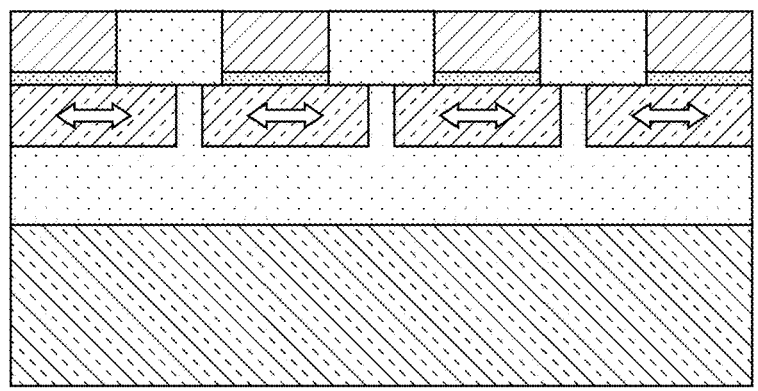

The gate material can then be planarised so as to form the gate block 40 between the stressing blocks 30*b*, 30*c* (FIG. 5D).

Figure 5E:
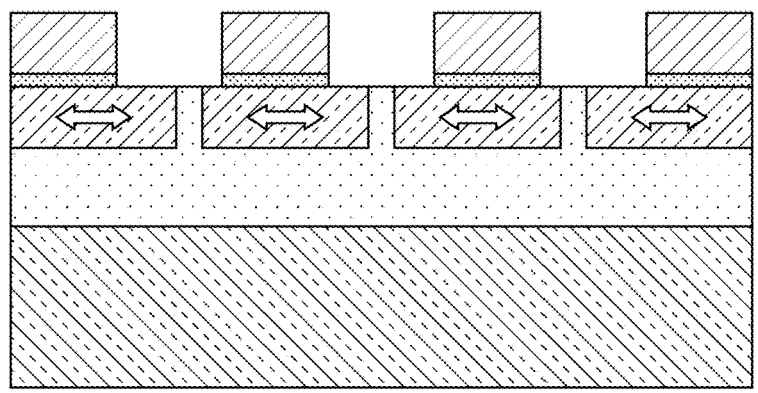

The stressed material 32 is then removed (FIG. 5E and step E$_7$ on the diagram in FIG. 7).

Figure 6A:
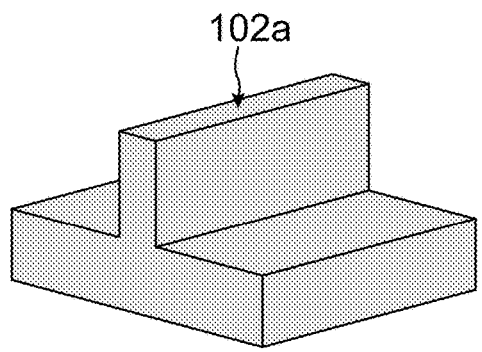
FIGS. 6A-6F show a variant of the method according to the invention in order to memorise a stress in a semiconducting zone of a finFET transistor channel.
Figure 6B:
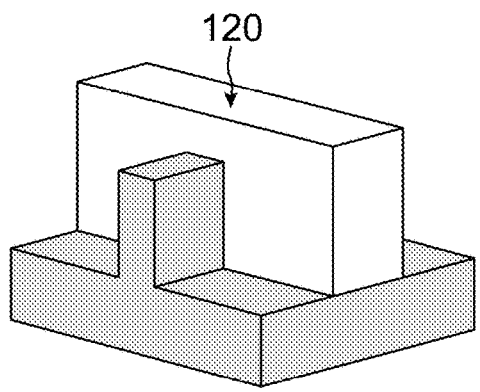

Another example of a method allows for straining a semiconducting zone of a finFET type transistor channel (FIGS. 6A-6F), the semiconducting channel zone 102*a* in this case being formed in a semiconducting bar, for example a silicon-based bar, formed in or on the surface layer of a substrate (FIG. 6A).

The next step is to form a sacrificial gate 120 encasing part of the semiconducting bar (FIG. 6B), for example by deposition of a gate dielectric such as SiO$_2$ and a gate material such as polysilicon.

Figure 6C:
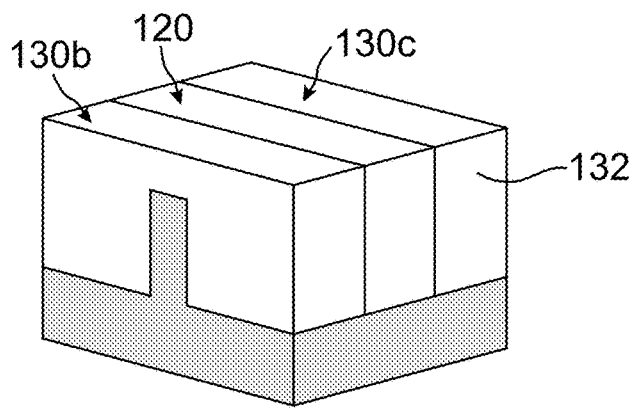

The blocks 130*b*, 130*c* based on a stressed material 132, for example silicon nitride, are then formed in contact with the encasing gate (FIG. 6C). The blocks 130*b*, 130*c* may for example be based on silicon nitride and are arranged so as to induce a given stress in the semiconducting zone 102*a* of the semiconducting bar covered by the sacrificial gate 120.

Figure 6D:
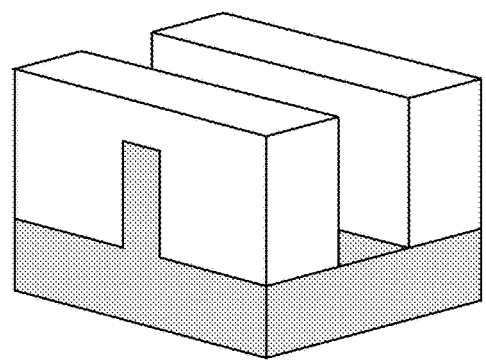
Figure 6E:
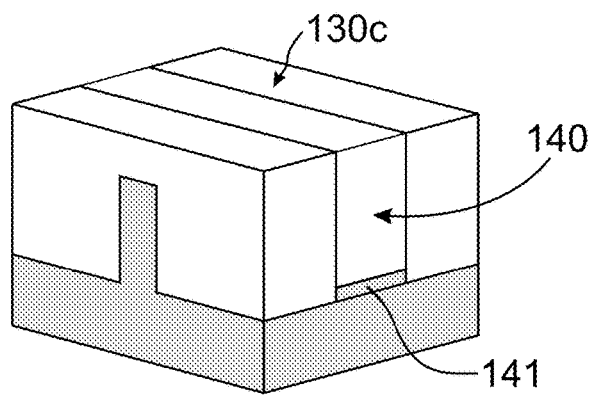

The sacrificial gate 120 is then removed (FIG. 6D).

The next step is to form an encasing gate 140 at the location of the sacrificial gate. This is done firstly by depositing a dielectric material 141 preferably with a high Young's modulus on and in contact with the zone 102*a* of the semiconducting bar that will be used to form a channel. The dielectric material 141 is advantageously made of a «high-k» material for example such as HfO$_2$ or Al$_2$O$_3$ or HfSiO$_x$N$_y$. The next step is to deposit a gate material 142 for example such as polysilicon. Formation of the encasing gate may be followed by a CMP planarisation step.

Figure 6F:
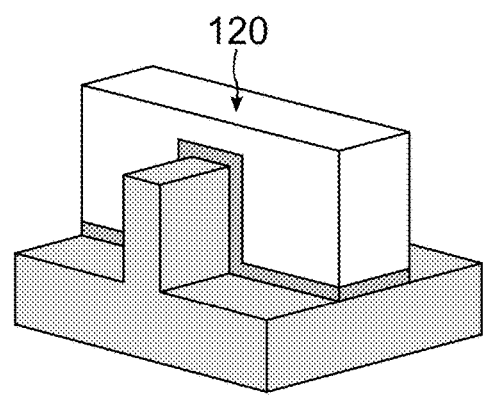

The next step is to remove the blocks 130*b*, 130*c* of stressed material 132 on each side of the gate block 140 (FIG. 6F). The stress applied in the semiconducting channel zone 102*a* is retained particularly due to the selected gate dielectric material.

As a variant to any one of the examples that have just been given, the method according to the invention can advantageously be applied on a semiconductor on insulator substrate in which the surface layer is based on a semiconducting material other than Si, for example Ge or a type III-V material.

A method according to any one of the variants described above can be adapted to stress an N type transistor channel zone and to stress a P type transistor channel zone formed on the same substrate.

In this case, stressed blocks based on a material for example such as compressive nitride can be formed on each side of the P transistor gate, and nitride stressed in tension around the gate of the N transistor.

The invention claimed is:

1. A method for making a device comprising at least one strained semiconducting zone configured to be a transistor channel, the method comprising, in the following order:
   a) forming a plurality of stress blocks based on a material having an intrinsic stress, around a zone based on a semiconducting material in which the transistor channel will be made and on which a transistor gate will be formed, the stress blocks inducing a stress in the zone;
   b) forming a gate block on the zone, the gate block being disposed between the stress blocks; and
   c) removing the stress blocks without removing the gate block,
   wherein the gate block has a Young's modulus and a thickness such that the stress blocks are removed in step c) and the induced stress is at least partially maintained in the zone after the stress blocks are removed.

2. The method according to claim 1, wherein the gate block is formed by depositing at least one gate dielectric and at least one gate material.

3. The method according to claim 1, wherein the gate block comprises at least one dielectric material deposited on the semiconducting material, the gate dielectric material having a Young's modulus higher than that of the semiconducting material in the zone.

4. The method according to claim 3, wherein the gate dielectric material is a High-k type material.

5. The method according to claim 4, wherein the gate dielectric material is HfO$_2$ or Al$_2$O$_3$ or HfSiO$_x$N$_y$.

6. The method according to claim 1, further comprising:
   forming a sacrificial gate on said zone before step a), the stress blocks formed in step a) being disposed in contact with the sacrificial gate; and
   removing the sacrificial gate after step a) and before step b).

7. The method according to claim 6, further comprising thermal annealing before removing the sacrificial gate, to cause expansion of the sacrificial gate.

8. The method according to claim 1, further comprising, after step c):
   depositing a layer based on a stress material having an intrinsic elastic stress; and
   performing thermal annealing.

9. The method according to claim 1, further comprising forming insulating spacers in contact with lateral flanks of the gate block, after step c).

10. The method according to claim 1, wherein the material having the intrinsic stress is a dielectric material, the method further comprising forming insulating spacers in the dielectric material.

11. The method according to claim 1,
   wherein the zone forms part of a region of a surface layer delimited by at least one trench filled with an insulating material, and wherein the zone is supported on a layer of the insulating material, the method further comprising performing thermal annealing to cause creep in the insulating material, after step b).

12. The method according to claim 1, wherein the zone is located in a surface layer of a semiconductor on insulator type substrate and is supported on an insulating layer of the semiconductor on insulator type substrate, the insulating layer being supported on a semiconducting layer.

13. The method according to claim 1, wherein the device comprises a FinFET type transistor, the zone being located in a semiconducting bar of the FinFET type transistor.

14. The method according to claim 1, wherein the device comprises a strained channel transistor comprising at least one strained semiconducting zone configured to be a transistor channel.

15. The method according to claim 1, wherein the stress blocks are formed directly on the semiconducting material in which the transistor channel will be made.

* * * * *